United States Patent [19]
Lin et al.

[11] Patent Number: 6,142,301
[45] Date of Patent: Nov. 7, 2000

[54] EXPANDABLE MODULAR CONTAINER SYSTEM

[75] Inventors: Po-Chih Lin, Taipei, Taiwan; Lenny You; Lionel Luan, both of Shang-Hai, China

[73] Assignee: Inventec Corporation, Taipei, Taiwan

[21] Appl. No.: 09/390,409

[22] Filed: Sep. 3, 1999

[30] Foreign Application Priority Data

Sep. 5, 1998 [TW] Taiwan ................................. 87214680

[51] Int. Cl.⁷ .................................................. B65D 21/02
[52] U.S. Cl. ........................... 206/511; 220/23.6; 206/821
[58] Field of Search .................................... 206/511, 512, 206/509; 220/234, 23.6

[56] References Cited

U.S. PATENT DOCUMENTS

| | | | |
|---|---|---|---|
| 647,388 | 4/1900 | Evans | 206/511 |
| 2,961,139 | 11/1960 | Nobili | 206/511 |
| 3,053,397 | 9/1962 | Bliss | 206/511 |
| 3,902,270 | 9/1975 | Molenaar | 206/511 |
| 3,955,681 | 5/1976 | De Zinno | 206/511 |
| 3,981,410 | 9/1976 | Schurch | 206/511 |
| 4,711,355 | 12/1987 | Veeman | 206/511 |
| 4,878,313 | 11/1989 | Polesel | 206/511 |

*Primary Examiner*—Joseph M. Moy
*Attorney, Agent, or Firm*—Birch, Stewart, Kolasch & Birch, LLP

[57] ABSTRACT

An expandable modular container system. A plurality of container modules stacked one on top of the other are coupled together by a plurality of exterior coupling units coupled both to each other in a column and to the container module on opposing sides of the container modules. The container modules can be quickly and securely coupled one on top the other, thereby achieving a stable and space saving arrangement. The coupling units also serve to protect the container module from damage caused by collision between modules.

13 Claims, 3 Drawing Sheets

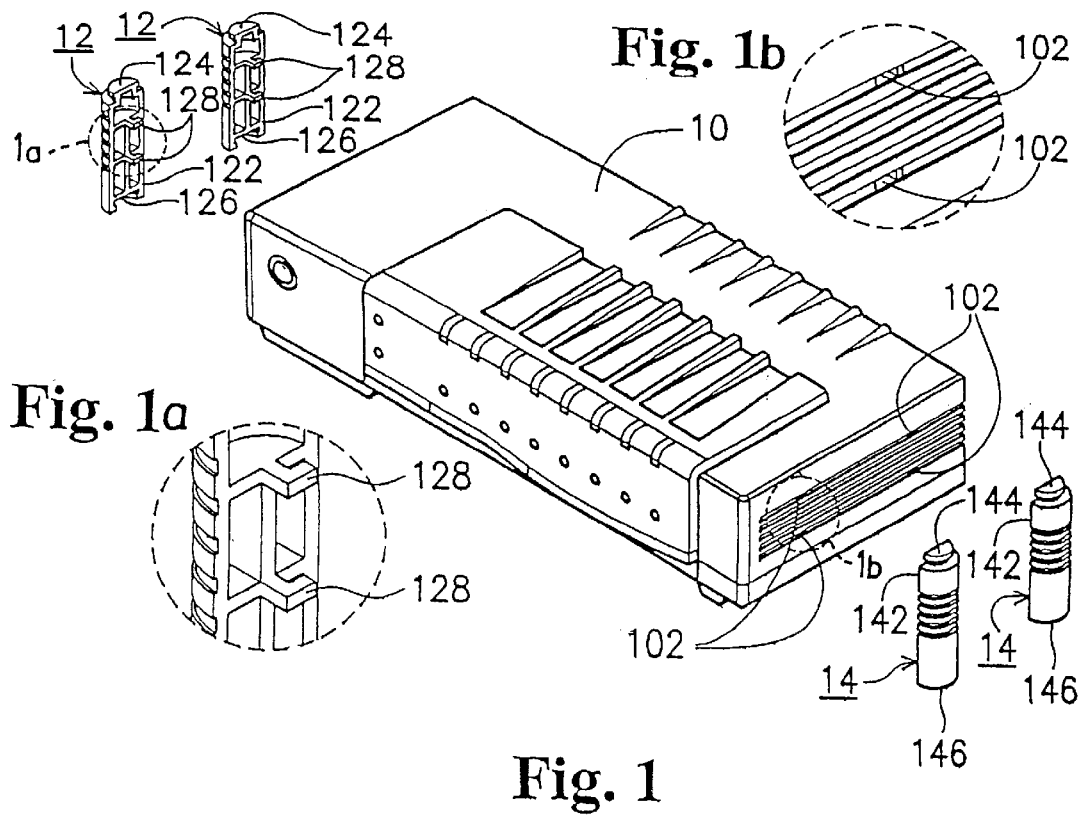
Fig. 1a
Fig. 1b
Fig. 1
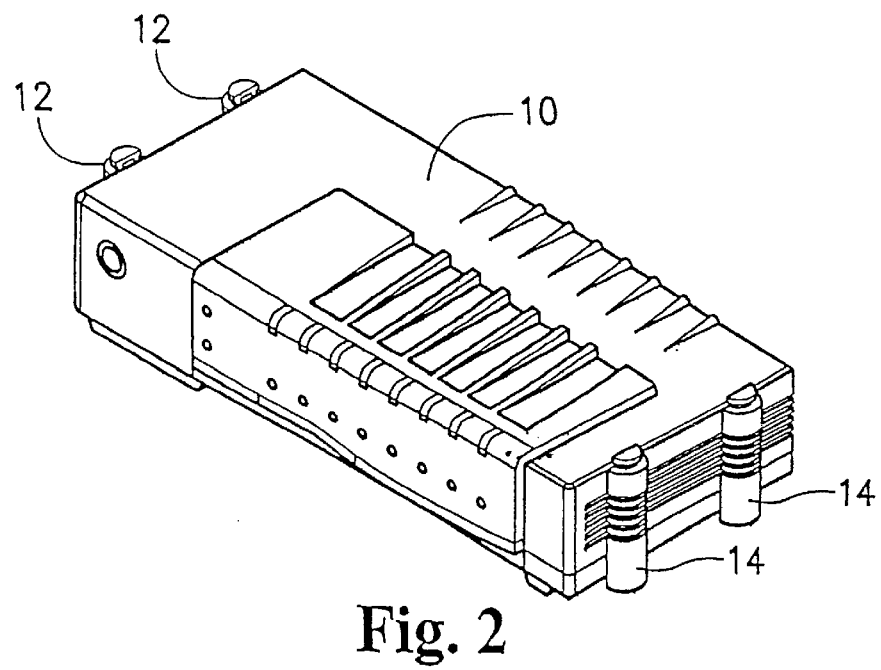
Fig. 2

EXPANDABLE MODULAR CONTAINER SYSTEM

BACKGROUND OF THE INVENTION

1. Field of the Invention

The present invention relates to an expandable modular container system. More specifically, the invention relates to container modules of horizontal type that can be quickly and securely coupled one on top of the other and in series by means of a plurality of exterior coupling units, thereby achieving a stable and space saving arrangement.

2. Description of Related Art

Conventionally, when two or more box devices (for example, networking hubs or any other electronic devices) of rectangular shape are stacked on top of each other with the large parallel surfaces lying horizontally, the only supporting and fastening aids that these box devices can rely on are a multiplicity of feet (usually four) directly underneath each said device. Such a stacking arrangement is usually unstable due to the elevated center of gravity, and the electrical wiring of said box devices without first unstacking the pile usually proves to be a big challenge. In some unfavorable cases, the entire pile of stacked box devices might tumble and drop to the ground if someone accidentally tips it over from the side.

Furthermore, most conventional expandable modular container systems for box devices can only be locked in position for one or two directions, thus the integrally formed coupling units of said box devices tend to slip occasionally. In addition, conventional expandable modular container systems are usually excessively complex in their coupling and overall structural design, so the cost of manufacturing is very high. As a result, the consuming public ends up paying a high cost in maintaining the system because it is necessary to replace an entire module when only the coupling elements need replacement.

SUMMARY OF THE INVENTION

Accordingly, it is an object of the present invention to provide an expandable modular container system in which modules can be quickly and securely coupled one on top of the other and in series by means of a plurality of exterior coupling units, thereby achieving a stable and space saving arrangement.

The expandable modular container system of this invention comprises: at least one container body of horizontal type having a first coupling element formed on a first sidewall thereof and a third coupling element formed on second sidewall thereof; at least one first coupling unit having a first support surface, a first anchoring member, and a second anchoring member, wherein a second coupling element is formed on the first support surface for coupling to the first coupling element, and the first anchoring member of a first coupling unit can be coupled with the second anchoring member of an abutting first coupling unit; and at least one second coupling unit having a second support surface, a third anchoring member, and a fourth anchoring member, wherein a fourth coupling element is formed on the second support surface for coupling to the third coupling element, and the third anchoring member of a second coupling unit can be coupled with the fourth anchoring member of an abutting second coupling unit; wherein, at least one container body is coupled to at least one coupling unit, and preferably a plurality of container bodies are stacked one on top of the other and coupled to at least one column of first coupling units coupled one on top of the other at the first side wall, wherein each first coupling unit is coupled to its abutting first coupling units by means of the first and second coupling members, and each second coupling unit is coupled to its abutting second coupling units by means of the third and fourth coupling members so as to form a stable stack of coupled container bodies.

Since adjacent coupling units are securely locked together, the container bodies disposed on the coupling units are kept square and stable. Further, even when uncoupled, the coupling units protect the container modules from damage caused by accidental collision between modules. Since only one type of coupling unit and container body is used, it is relatively cheap and easy to maintain the entire expandable modular container system. In the case of a failed coupling, all that is required is a replacement of the coupling unit.

BRIEF DESCRIPTION OF THE DRAWINGS

Other objects, features, and advantages of the present invention will become apparent from the following detailed description of the preferred but non-limiting embodiment. The description is made with reference to the accompanying drawings in which:

FIG. 1 is a perspective drawing of the horizontal expandable modular container system of this invention in an uncoupled state;

FIG. 1a is an enlarged view of a portion of FIG. 1;

FIG. 1b is an enlarged view of a portion of FIG. 1;

FIG. 2 is a perspective drawing of the horizontal expandable modular container system with coupling units attached to the container body;

DETAILED DESCRIPTION OF THE PREFERRED EMBODIMENT

The horizontal type expandable modular container system of the present invention comprises a horizontal type container body 10, for enclosing networking hubs or any other electronic devices, having at least a first coupling slot set 102 and at least a second coupling slot set 102 on opposing side walls of the container body. Each of the coupling slot sets can have, for example, four identical slots, as shown. Although one side of the expandable container module is blocked in the perspective view, it is according to a preferred embodiment of the present invention that both the blocked side and the exposed side are identical in function, appearance, and design features.

Figure 3:
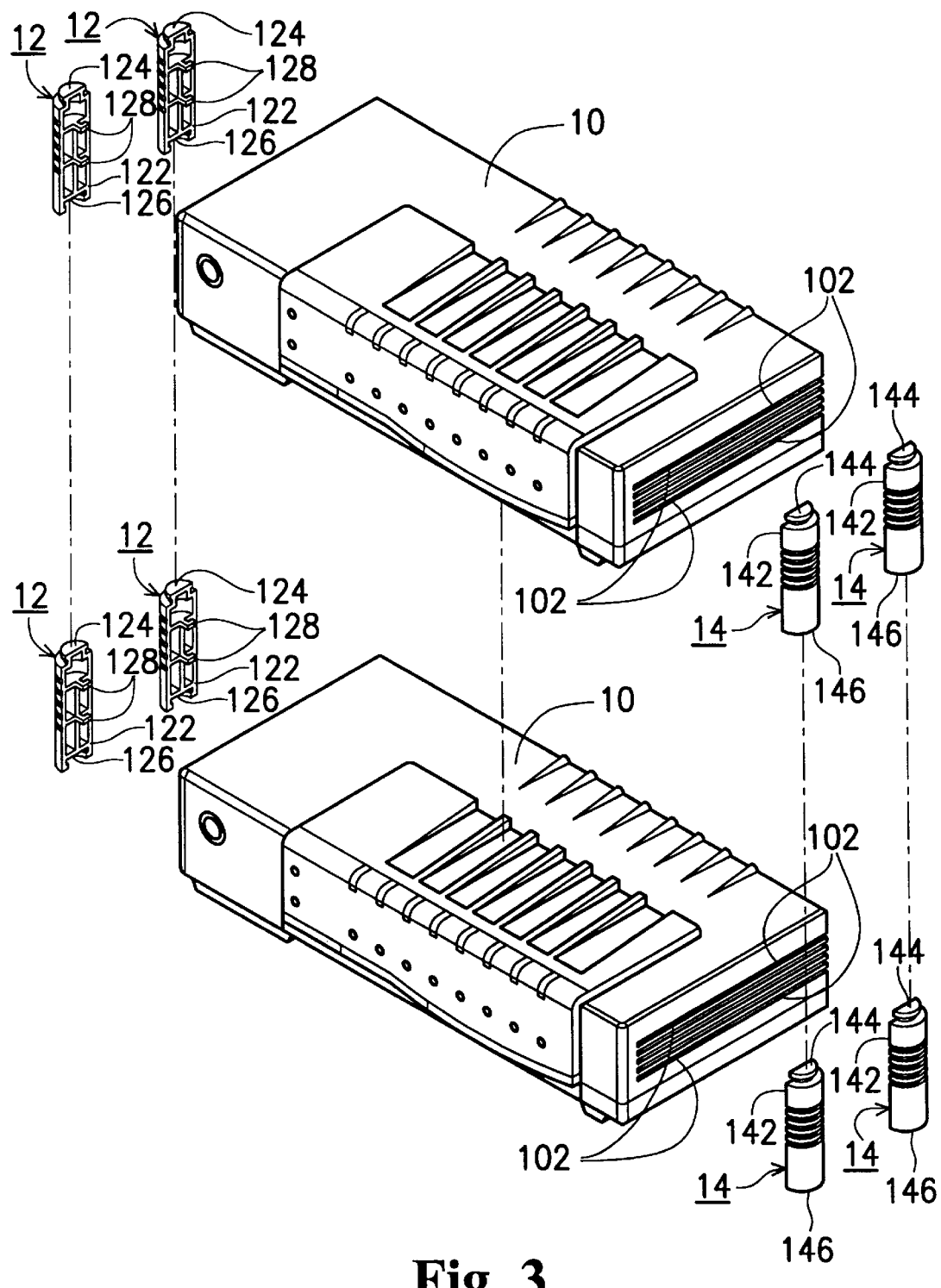
FIG. 3 is a perspective drawing of two horizontal type container bodies and a plurality of coupling units before they are coupled together.
Figure 4:
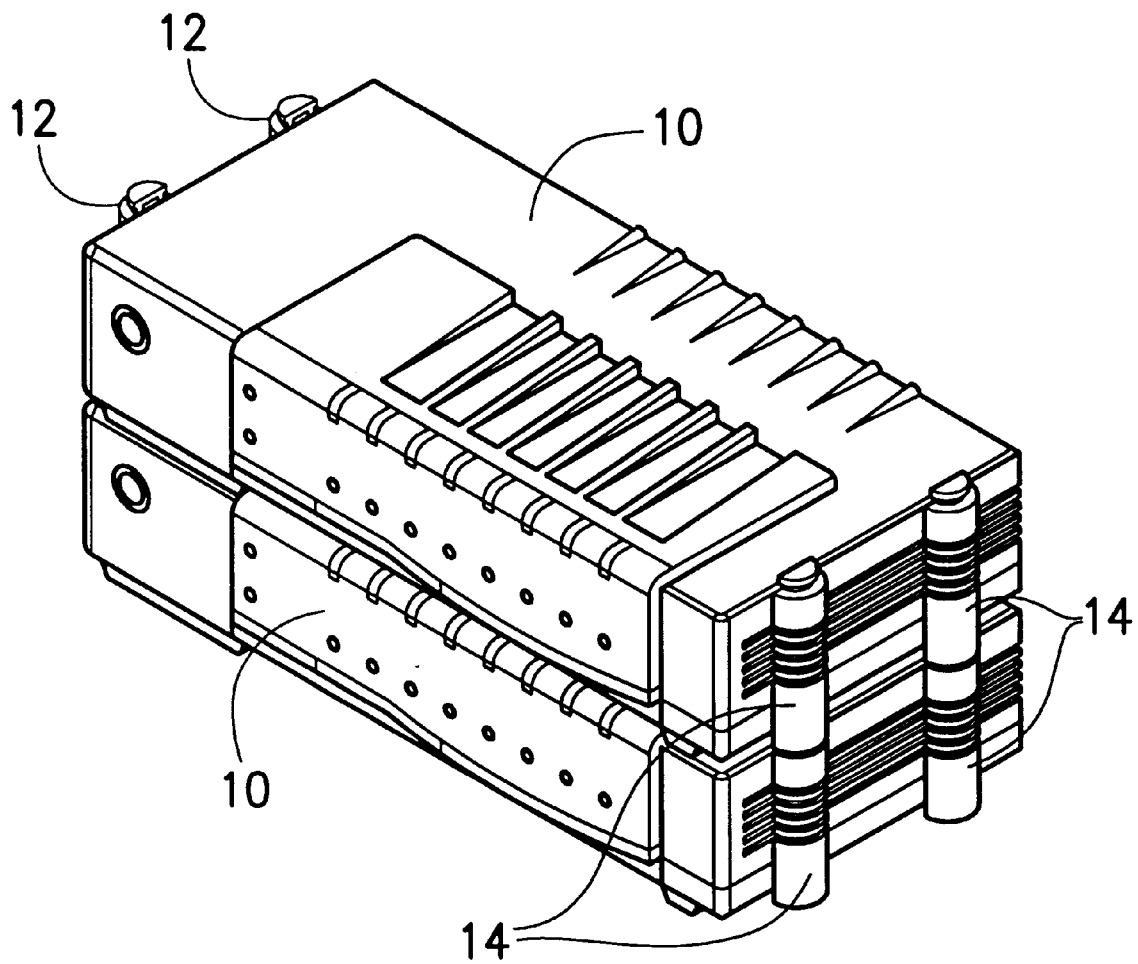
FIG. 4 is a perspective drawing of two coupled horizontal type modular containers with coupling units attached and coupled.

The horizontal type expandable modular container system of the present invention further comprises a plurality of coupling units 12, which can have, for example, a semi-cylindrical shape. The coupling units 12 comprise a first supporting surface 122, a first anchoring member 124, and a second anchoring member 126 such that said first anchoring member 124 is embraced by said second anchoring member 126 when two coupling units are to be coupled together as shown in FIGS. 3 and 4. Further, the first supporting surface 122 has at least a first hook set 128 integrally formed for coupling to the first or second coupling slot set of the horizontal type container body 10. The first hook set 128 itself is integrally formed consisting of two spaced-apart hooks, as shown in FIG. 1, but there is no limit to the number of hooks for each integrally formed hook set as long as the number of slots corresponds with that of the hooks. Also, as shown in FIGS. 3 and 4, two or more of the first coupling units 12 can be applied on a same side of the horizontal type container body 10.

According to the preferred embodiment of the present invention, the horizontal type expandable container module comprises at least one first coupling unit 12 and at least one second coupling unit 14 for each container module; a plurality of container modules are stacked together and coupled by means of the anchoring members 124 and 126. The second coupling unit 14 can be of a different type than the first coupling unit 12; however, for the benefit of low manufacturing cost and easy operation, it is according to the first embodiment of the present invention that the first and the second coupling units are identical in every respect. That is to say, the second coupling unit 14 is also a semi-cylindrical shape having a second supporting surface 142, a third anchoring member 144, and a fourth anchoring member 146 such that said third anchoring member 144 is embraced by a fourth anchoring member 146 of another coupling unit when two anchoring units are coupled together, as shown in FIGS. 3 and 4. Further, the second supporting surface 142 has at least a second hook set (not shown) integrally formed for coupling to the second coupling slot set 102 of the horizontal type container body 10. The second hook set (not shown) can consist of two spaced-apart hooks, but there is no limit on how many hooks are allowed as long as the number corresponds to that of the insertion slots.

Also as shown in FIGS. 3 and 4, two or more of the second coupling unit 14 can be applied on the same side of the horizontal type container body 10. The second coupling units 14 serve the same function as the first coupling units 12.

The expandable modular container system of the present invention is ideal for enclosing all types of electronic devices. The interlocking of adjacent coupling units one of top of the other provides a stable and compact disposition of the container modules. Furthermore, the coupling units provide protection to the container bodies from damage caused by accidental collision between modules.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An expandable modular container system having at least two container bodies, wherein each container body is stacked on top of the other, the expandable container system comprising:

a first sidewall on each of the container bodies;

a first coupling element comprised of one or more slots formed on the first sidewall of each of the stacked container bodies;

at least one detachable first coupling unit having a first support surface facing the first sidewall of each container body to be installed thereon, a first anchoring member, and a second anchoring member for coupling to the first anchoring member of another first coupling unit; and a second coupling element formed on the first support surface of the first coupling unit, which is comprised of one or more hooks receivable by the first coupling element of each container body for coupling said detachable first coupling unit to the first coupling element of each of the stacked container bodies via the first sidewall;

wherein the first anchoring member of a first coupling unit is coupled with the second anchoring member of another adjoining first coupling unit, thereby anchoring two or more stacked container bodies, whereby one container body is on top of an other container body, and the stacked container bodies are aided by the coupling action of at least one column of coupled first coupling units along the abutting first sidewalls of each stacked container body.

2. The expandable modular container system as claimed in claim 1, wherein the detachable first coupling unit has a semi-cylindrical shaped with an upper first longitudinal end and a lower second longitudinal end, and wherein the first anchoring member is located at the first longitudinal end while the second anchoring member is located at the second longitudinal end.

3. The expandable modular container system as claimed in claim 1, wherein the first anchoring member is a semi-disk shaped protrusion while the second anchoring member is a semi-disk shaped groove, and wherein the semi-disk shaped protrusion of a first coupling unit is receivable by the semi-disk shaped groove of another adjoining first coupling unit for forming a column of coupled first coupling units.

4. The expandable modular container system as claimed in claim 1, wherein the first and second anchoring members are both integrally formed to the first coupling unit.

5. The expandable modular container system as claimed in claim 1, wherein the first coupling element is integrally formed to the first sidewall of the container body while the second coupling element is integrally formed to the first support surface of the first coupling unit.

6. An expandable modular container system having at least two container bodies, wherein each container body is stacked on top of the other, the expandable modular container system comprising:

a first sidewall on each of the container bodies;

a second sidewall on each of the container bodies;

a first coupling element comprised of one or more slots formed on the first sidewall of each of the stacked container bodies;

a third coupling element comprised of one or more slots formed on the second sidewall of each of the stacked container bodies;

at least one detachable first coupling unit having a first support surface facing the first sidewall of each container body to be installed thereon, a first anchoring member, and a second anchoring member for coupling to the first anchoring member of another first coupling unit; and a second coupling element formed on the first support surface of the first coupling unit, which is comprised of one or more hooks receivable by the first coupling element of a container body for coupling said detachable first coupling unit to the first coupling element of each of the stacked container bodies via the first sidewall;

at least one detachable second coupling unit having a second support surface facing the second sidewall of the container body to be installed thereon, wherein each second coupling unit comprises a third anchoring member and a fourth anchoring member for coupling to the third anchoring member of another second coupling unit; and a fourth coupling element formed on the second support surface of the second coupling unit, which is comprised of one or more hooks receivable by the third coupling element of a container body for coupling said detachable second coupling unit to the third coupling element of each of the stacked container bodies via the second sidewall;

wherein the first anchoring member of a first coupling unit is coupled with the second anchoring member of another adjoining first coupling unit while the third anchoring member of a second coupling unit is coupled with the fourth anchoring member of another adjoining second coupling unit, thereby anchoring two or more stacked container bodies, whereby one container body is on top of an other container body, and the stacked container bodies are aided by the coupling action of at least one column of coupled first coupling units along the abutting first sidewalls and one column of coupled second coupling units along the abutting second sidewalls.

7. The expandable modular container system as claimed in claim 6, wherein the detachable first coupling unit has a semi-cylindrical shape with an upper first longitudinal end and a lower second longitudinal end, and wherein the first anchoring member is located at the first longitudinal end while the second anchoring member is located at the second longitudinal end.

8. The expandable modular container system as claimed in claim 6, wherein the detachable second coupling unit has a semi-cylindrical shape with an upper first longitudinal end and a lower second longitudinal end, and wherein the third anchoring member is located at the first longitudinal end while the fourth anchoring member is located at the second longitudinal end.

9. The expandable modular container system as claimed in claim 6, wherein the first and third anchoring members are semi-disk shaped protrusions while the second and fourth anchoring members are semi-disk shaped grooves, wherein the semi-disk shaped protrusion of a first coupling unit is receivable by the semi-disk shaped groove of another adjoining first coupling unit for forming a column of coupled first coupling units, and wherein the semi-disk shaped protrusion of a second coupling unit is receivable by the semi-disk shaped groove of another adjoining second coupling unit for forming a column of coupled second coupling units.

10. The expandable modular container system as claimed in claim 6, wherein the first and second anchoring members are both integrally formed to the first coupling while the third and fourth anchoring members are both integrally formed to the second coupling unit.

11. The expandable modular container system as claimed in claim 6, wherein the first and second coupling unit and the first and third coupling element are identical, respectively.

12. The expandable modular container system as claimed in claim 6, wherein first and third coupling elements are integrally formed to the container body while the second and fourth coupling elements are integrally formed to the first and second support surfaces, respectively.

13. The expandable modular container system as claimed in claim 6, wherein the first and second sidewalls are formed on opposite sides of each container body.

* * * * *